(12) United States Patent
Campbell

(10) Patent No.: US 7,924,608 B2
(45) Date of Patent: Apr. 12, 2011

(54) FORCED ION MIGRATION FOR CHALCOGENIDE PHASE CHANGE MEMORY DEVICE

(75) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 364 days.

(21) Appl. No.: 11/875,805

(22) Filed: Oct. 19, 2007

(65) Prior Publication Data

US 2008/0121859 A1    May 29, 2008

Related U.S. Application Data

(60) Provisional application No. 60/853,068, filed on Oct. 19, 2006.

(51) Int. Cl.
*G11C 11/00* (2006.01)

(52) U.S. Cl. ............. 365/163; 365/148; 257/2; 257/5; 438/95; 977/754

(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 6,646,902 B2 | 11/2003 | Gilton et al. |
| 6,784,018 B2 | 8/2004 | Campbell et al. |
| 6,795,338 B2 | 9/2004 | Parkinson et al. |
| 6,812,087 B2 | 11/2004 | Giltom et al. |
| 6,813,176 B2 | 11/2004 | Gilton et al. |
| 6,813,178 B2 | 11/2004 | Campbell et al. |
| 6,849,868 B2 | 2/2005 | Campbell |
| 6,856,002 B2 | 2/2005 | Moore et al. |
| 6,861,367 B2 | 3/2005 | Gilton et al. |
| 6,864,521 B2 | 3/2005 | Moore et al. |
| 6,867,064 B2 | 3/2005 | Campbell et al. |
| 6,867,114 B2 | 3/2005 | Moore et al. |

(Continued)

OTHER PUBLICATIONS

Bez, R.; Pirovano, A. "Non-volatile memory technologies: emerging concepts and new materials" *Materials Science in Semiconductor Processing* 7 (2004) 349-355.

(Continued)

*Primary Examiner* — Richard Elms
*Assistant Examiner* — Harry W Byrne
(74) *Attorney, Agent, or Firm* — Zarian Midgley & Johnson PLLC

(57) ABSTRACT

Non-volatile memory devices with two stacked layers of chalcogenide materials comprising the active memory device have been investigated for their potential as phase change memories. The devices tested included GeTe/SnTe, $Ge_2Se_3$/SnTe, and $Ge_2Se_3$/SnSe stacks. All devices exhibited resistance switching behavior. The polarity of the applied voltage with respect to the SnTe or SnSe layer was critical to the memory switching properties, due to the electric field induced movement of either Sn or Te into the Ge-chalcogenide layer. One embodiment of the invention is a device comprising a stack of chalcogenide-containing layers which exhibit phase change switching only after a reverse polarity voltage potential is applied across the stack causing ion movement into an adjacent layer and thus "activating" the device to act as a phase change random access memory device or a reconfigurable electronics device when the applied voltage potential is returned to the normal polarity. Another embodiment of the invention is a device that is capable of exhibiting more that two data states.

20 Claims, 12 Drawing Sheets

U.S. PATENT DOCUMENTS

| | | | |
|---|---|---|---|
| 6,867,996 B2 | 3/2005 | Campbell et al. |
| 6,881,623 B2 | 4/2005 | Campbell et al. |
| 6,888,155 B2 | 5/2005 | Campbell |
| 6,891,749 B2 | 5/2005 | Campbell et al. |
| 6,912,147 B2 | 6/2005 | Campbell |
| 6,921,912 B2 | 7/2005 | Campbell |
| 6,930,909 B2 | 8/2005 | Moore et al. |
| 6,953,720 B2 | 10/2005 | Moore et al. |
| 6,955,940 B2 | 10/2005 | Campbell et al. |
| 6,956,761 B2 | 10/2005 | Campbell |
| 6,961,277 B2 | 11/2005 | Moore et al. |
| 6,998,697 B2 | 2/2006 | Campbell et al. |
| 7,015,494 B2 | 3/2006 | Campbell |
| 7,018,863 B2 | 3/2006 | Moore et al. |
| 7,030,405 B2 | 4/2006 | Campbell |
| 7,050,327 B2 | 5/2006 | Campbell |
| 7,056,762 B2 | 6/2006 | Moore et al. |
| 7,061,004 B2 | 6/2006 | Campbell |
| 7,064,080 B2 | 6/2006 | Gilton et al. |
| 7,067,348 B2 | 6/2006 | Campbell et al. |
| 7,087,454 B2 | 8/2006 | Campbell et al. |
| 7,087,919 B2 | 8/2006 | Campbell et al. |
| 7,105,864 B2 | 9/2006 | Campbell et al. |
| 7,151,273 B2 | 12/2006 | Campbell et al. |
| 7,153,721 B2 | 12/2006 | Campbell |
| 7,163,837 B2 | 1/2007 | Moore et al. |
| 7,190,048 B2 | 3/2007 | Campbell |
| 7,220,982 B2 | 5/2007 | Campbell |
| 7,223,627 B2 | 5/2007 | Moore et al. |
| 7,274,034 B2 | 9/2007 | Campbell et al. |
| 7,277,313 B2 | 10/2007 | Campbell et al. |
| 7,282,783 B2 | 10/2007 | Campbell |
| 7,288,784 B2 | 10/2007 | Moore et al. |
| 7,289,349 B2 | 10/2007 | Campbell et al. |
| 7,294,527 B2 | 11/2007 | Campbell et al. |
| 7,304,368 B2 | 12/2007 | Campbell |
| 7,315,465 B2 | 1/2008 | Campbell et al. |
| 7,317,200 B2 | 1/2008 | Campbell |
| 7,317,567 B2 | 1/2008 | Campbell |
| 7,326,950 B2 | 2/2008 | Campbell |
| 7,329,558 B2 | 2/2008 | Campbell |
| 7,332,735 B2 * | 2/2008 | Campbell | 257/5 |
| 7,344,946 B2 | 3/2008 | Moore et al. |
| 7,348,205 B2 | 3/2008 | Campbell et al. |
| 7,348,209 B2 | 3/2008 | Campbell |
| 7,354,793 B2 | 4/2008 | Campbell |
| 7,365,411 B2 | 4/2008 | Campbell |
| 7,366,030 B2 | 4/2008 | Campbell et al. |
| 7,385,868 B2 | 6/2008 | Moore et al. |
| 7,387,909 B2 | 6/2008 | Campbell |
| 7,393,798 B2 | 7/2008 | Campbell |
| 7,396,699 B2 | 7/2008 | Campbell et al. |
| 7,433,227 B2 | 10/2008 | Campbell et al. |
| 7,459,764 B2 | 12/2008 | Moore et al. |
| 7,491,962 B2 | 2/2009 | Liu et al. |
| 7,518,212 B2 | 4/2009 | Moore et al. |
| 7,542,319 B2 | 6/2009 | Campbell et al. |
| 7,550,818 B2 | 6/2009 | Moore et al. |
| 7,579,615 B2 | 8/2009 | Daley et al. |
| 7,586,777 B2 | 9/2009 | Campbell |
| 7,609,563 B2 | 10/2009 | Campbell et al. |
| 7,619,247 B2 | 11/2009 | Moore et al. |
| 7,646,007 B2 | 1/2010 | Campbell et al. |
| 7,659,205 B2 | 2/2010 | Campbell |
| 7,663,137 B2 | 2/2010 | Campbell |
| 7,682,992 B2 | 3/2010 | Campbell |
| 7,692,177 B2 | 4/2010 | Moore et al. |
| 7,701,760 B2 | 4/2010 | Campbell et al. |
| 7,709,885 B2 | 5/2010 | Daley et al. |
| 7,723,713 B2 | 5/2010 | Campbell et al. |
| 7,745,808 B2 | 6/2010 | Campbell |
| 7,749,853 B2 | 7/2010 | Campbell |
| 7,759,665 B2 | 7/2010 | Campbell |
| 7,785,976 B2 | 8/2010 | Campbell |
| 2002/0168852 A1 * | 11/2002 | Harshfield et al. | 438/650 |
| 2003/0047765 A1 | 3/2003 | Campbell |
| 2003/0143782 A1 | 7/2003 | Gilton et al. |
| 2003/0146427 A1 | 8/2003 | Campbell |
| 2004/0211957 A1 | 10/2004 | Moore et al. |
| 2004/0223390 A1 | 11/2004 | Campbell et al. |
| 2005/0247927 A1 | 11/2005 | Campbell |
| 2005/0286294 A1 | 12/2005 | Campbell |
| 2006/0045974 A1 | 3/2006 | Campbell et al. |
| 2006/0131555 A1 | 6/2006 | Liu et al. |
| 2006/0186394 A1 | 8/2006 | Campbell |
| 2007/0029537 A1 | 2/2007 | Campbell | 257/4 |
| 2007/0145463 A1 | 6/2007 | Campbell |
| 2007/0158631 A1 | 7/2007 | Daley et al. |
| 2007/0218583 A1 | 9/2007 | Farnworth et al. |
| 2008/0067489 A1 | 3/2008 | Campbell |
| 2008/0078983 A1 * | 4/2008 | Raberg | 257/4 |
| 2008/0121859 A1 | 5/2008 | Campbell |
| 2008/0164456 A1 | 7/2008 | Campbell |
| 2008/0185574 A1 | 8/2008 | Campbell et al. |
| 2008/0188034 A1 | 8/2008 | Campbell |
| 2008/0237563 A1 | 10/2008 | Campbell |
| 2009/0124041 A1 | 5/2009 | Liu et al. |
| 2010/0027324 A1 | 2/2010 | Campbell |

OTHER PUBLICATIONS

Lacaita, A.L. "Phase-change memories: state-of-the-art, challenges and perspectives" *Solid-State Electronics* 50 (2006) 24-31].

Adler, D.; Henisch, H.K.; Mott, N. "The Mechanism of Threshold Switching in Amorphous Alloys" *Reviews of Modern Physics* 50 (1978) 209-220.

Ovshinsky, S.R. "Reversible Electrical Switching Phenomena in Disordered Structures" *Phys. Rev. Lett.* 21 (1968), 1450-1453.

Hudgens, S.; Johnson, B. "Overview of Phase-Change Chalcogenide Nonvolatile memory Technology" *MRS Bulletin*, Nov. 2004, 829-832.

Storey, T.; Hunt, K.K.; Graziano, M.; Li, B.; Bumgarner, A.; Rodgers, J.; Burcin, L. "Characterization of the 4Mb Chalcogenide-Random Access Memory" *IEEE Non-Volatile Memory Technology Symposium* (2005) 97-104.

Cho, W.Y.; Cho, B.-H.; Choi, B.-G.; Oh, H.-R.; Kang, S.; Kim, K.-S.; Kim. K.-H.; Kim, E-E.; Kwak, C.-K.; Byun, H.-G.; Hwang, Y.; Ahn, S.; Koh, G.-H.; Jeong, G.; Jeong, H.; Kim, K. "A 0.18-um 3.0-V 64-Mb nonvolatile phase-transition random access memory (PRAM)" *IEEE J. Solid-State Circuits* 40 (2005) 293-300.

Wolters, R.A.M. "Low-cost and nanoscale non-volatile memory concept for future silicon chips" *Nature Materials* 4 (2005) 347-352.

Hamann, H.F.; O'Boyle, M.; Martin, Y.C.; Rooks, M.; Wickramasinghe, H.K. "Ultra-high-density phase-change storage and memory" *Nature Materials* 5 (2006) 383-387.

Chen, J.; Rubin, K.A.; Barton, R.W. "Compound materials for reversible, phase-change optical data storage" *Appl. Phys. Lett.* 49 (1986) 502-504.

An, S.-H.; Kim, D.; Kim, S.Y. "New crystallization kinetics of phase-change of $Ge_2S_2Te_5$ at moderately elevated temperature" Jpn. J. Appl. Phys. 41 (2002) 7400-7401.

Esaki, L.; Stiles, P.J. "New Type of Negative Resistance in Barrier Tunneling" *Phys. Rev. Lett.* 16 (1966) 1108-1111.

Lai, Y.F.; Feng, J.; Qiao, B.W.; Cai, Y.F.; Lin, Y.Y.; Tang, T.A.; Cai, B.C.; Chen, B. "Stacked chalcogenide layers used as multi-state storage medium for phase-change memory" *Appl. Phys. A* 84 (2006) 21-25.

Chen, M.; Rubin, K.A. "Progress of erasable phase-change materials" *SPIE* vol. 1078 *Optical Data Storage Topical Meeting* (1989) 150-156.

Ielmini, D.; Mantegazza, D.; Lacaita, A.L. "Parasitic reset in the programming transient of PCMs" *IEEE Electron Device Letters* 26 (2005) 799-801.

Campbell, K.A.; Anderson, C.M., Microelectronics Journal 38 (2007) 52-59.

Narayanan,R.A.; Asokan, S.; Kumar, A. "Influence of Chemical Disorder on Electrical Switching in Chalcogenide Glasses" *Phys. Rev. B* 63 (2001) 092203-1-092203-4; and.

Asokan, S. "Electrical swtiching in chalcogenide glasses—some newer insights" *J. Optoelectronics and Advanced Materials* 3 (2001) 753-756.

Adler, David., "Switching Phenomena in Thin Films" J. Vac. Sci. Technol 10 (1973) 728-738.

Ande, H.K., "A new approach to the design, fabrication, and testing of chalcogenide-based multi-state phase-change nonvolatile memory", "Circuits and Systems", Aug. 10, 2008, pp. 570-573, Published in: US.

Campbell, Kristy A., et al, "Phase-change memory devices with stacked Ge-chalcogenide/Sn-chalcogenide layers", "Microelectronics Journal", Jan. 1, 2007, pp. 52-59, vol. 38, No. 1, Published in: US.

Campbell, "Characterization of Sn, Zn, In, and Sb-containing GeSe alloys for phase-change electronic memory applications", "Materials Research Society Symposium Proceedings", Apr. 9, 2007, vol. 997, Published in: US.

Campbell, et al, "Chalcogenide bilayer materials used to create multi-state resistance variable devices", "Abstracts, 62nd Northwest Regional Meeting of the American Chemical Society", Jun. 17, 2007, vol. NW-234, Publisher: American Chemical Society, Published in: US.

Campbell et al, "Phase-change memory devices with stacked Ge-chalcogenide/Sn-chalcogenide layers", "Microelectronics Journal", Nov. 14, 2006, pp. 52-59, vol. 38, No. 1, Published in: US.

Davis, et al, "Synthesis and characterization of metal-doped chalcogenide glasses", "Abstracts, 62nd Northwest Regional Meeting of the American Chemical Society", Jun. 17, 2007, vol. NW-039, Publisher: American Chemical Society, Published in: US.

Devasia et al, "Influence of Sn Migration on phase transition in GeTe and Ge2Se3 thin films", "Applied Physics Letters", Apr. 9, 2010, pp. 141908, vol. 96, Published in: US.

Devasia et al, "Analyzing residual stress in bilayer chalcogenide Ge2Se3/SnTe films", "Thin Solid Films", Apr. 8, 2009, pp. 6516-6519, vol. 517, No. 24, Published in: US.

Gupta et al, "W-2W Current Steering DAC for Programming Phase Change Memory", Apr. 3, 2009, pp. 1-4, Publisher: WMED 2009. IEEE Workshop on Apr. 3, 2009, Published in: US.

Rapole et al, "Resistive Memory Sensing Using Delta-Sigma Modulation", Apr. 3, 2009, Publisher: WMED 2009. IEEE Workshop on Apr. 3, 2009, Published in: US.

Regner et al, "Integration of IC Industry Feature Sizes with University Back-End-of-Line Post Processing: Example Using a Phase-Change ", Apr. 3, 2009, pp. 1-4, Publisher: WMED 2009. IEEE Workshop on Apr. 3, 2009, Published in: US.

Oblea, Antonio S., et al, "Silver Chalcogenide Based Memristor Devices", Jul. 19, 2010, Publisher: IEEE World Congress on Computational Intelligence.

Oblea et al, "Memristor SPICE Model Simulation & Device Hardware Correlation", May 6, 2010, Publisher: IEEE, Published in: US.

Edwards, Arthur H., et al, "Density Functional Study of Ag in Ge2Se3", Oct. 25, 2009, pp. 1-7, Publisher: Non-Volatile Memory Technology Symposium, Published in: US.

Pino, Robinson E., et al, "Compact Method for Modeling and Simulation of Memristor Devices", Jun. 17, 2010, pp. 1-7, Publisher: 2010 IEEE/ACM International Symposium on Nanoscale Architectures (NANOARCH).

* cited by examiner

FORCED ION MIGRATION FOR CHALCOGENIDE PHASE CHANGE MEMORY DEVICE

This application claims priority of my prior provisional patent application, Ser. 60/853,068, filed on Oct. 19, 2006, entitled "Forced Ion Migration for Chalcogenide Phase Change Memory Device," which is incorporated herein by reference.

This work was partially supported by a NASA Idaho EPS-CoR grant, NASA grant NCC5-577.

BACKGROUND OF THE INVENTION

1. Field of the Invention

This invention relates generally to electronic memory devices, and more particularly to a method of inducing a non-phase change stack structure into a phase change stack memory structure.

2. Related Art

Research into new random access electronic memory technologies has grown significantly in the past 10 years due to the near realization of the scaling limits of DRAM and the low cycle lifetime, high power requirements, and radiation sensitivity of Flash. At the forefront of this research is the phase-change random access memory (PCRAM) [see Bez, R.; Pirovano, A. "Non-volatile memory technologies: emerging concepts and new materials" *Materials Science in Semiconductor Processing* 7 (2004) 349-355; and Lacaita, A. L. "Phase-change memories: state-of-the-art, challenges and perspectives" *Solid-State Electronics* 50 (2006) 24-31]. Phase-change memory is a non-volatile, resistance variable memory technology whereby the state of the memory bit is defined by the memory material's resistance. Typically, in a two state device, a high resistance defines a logic '0' (or 'OFF' state) and corresponds to an amorphous phase of the material. The logic '1' ('ON' state) corresponds to the low resistance of a crystalline phase of the material. The 'high' and 'low' resistances actually correspond to non-overlapping resistance distributions, rather than single, well-defined resistance values (FIG. 1).

The phase-change material is switched from high resistance to a low resistance state when a voltage higher than a 'threshold' voltage, $V_t$, is applied to the amorphous material [see Adler, D.; Henisch, H. K.; Mott, N. "The Mechanism of Threshold Switching in Amorphous Alloys" *Reviews of Modern Physics* 50 (1978) 209-220; and Adler, D. "Switching Phenomena in Thin Films" *J. Vac. Sci. Technol.* 10 (1973) 728-738] causing the resistance to significantly decrease (FIG. 2). The resultant increased current flow causes Joule heating of the material to a temperature above the material glass transition temperature. When a temperature above the glass transition temperature, but below the melting temperature, has been reached, the current is removed slowly enough to allow the material to cool and crystallize into a low resistance state ('write 1' current region, FIG. 2). The device can be returned to an amorphous state by allowing more current through the device, thus heating the material above the melting temperature, and then quickly removing the current to quench the material into an amorphous, high resistance state ('write 0' current region, FIG. 2).

Chalcogenide materials, those containing S, Se, or Te, have been the most widely investigated materials for electronic resistance variable memory applications since the discovery of the electronic resistance switching effect in a chalcogenide material ($As_{30}Te_{48}Si_{12}Ge_{10}$) by Ovshinsky almost 40 years ago [see Ovshinsky, S. R. "Reversible Electrical Switching Phenomena in Disordered Structures" *Phys. Rev. Lett.* 21 (1968), 1450-1453]. Chalcogenide materials are desirable for use in electronic memories due to the wide range of glasses they can form and the corresponding wide variety of glass transition and melting temperatures. One of the most well studied resistance switching chalcogenide materials is the $Ge_2Sb_2Te_5$ (GST) alloy [see Bez, R.; Pirovano, A. "Non-volatile memory technologies: emerging concepts and new materials" *Materials Science in Semiconductor Processing* 7 (2004) 349-355; and Hudgens, S.; Johnson, B. "Overview of Phase-Change Chalcogenide Nonvolatile memory Technology" *MRS Bulletin*, November 2004, 829-832]. GST has been used successfully in phase-change memory arrays [see Storey, T.; Hunt, K. K.; Graziano, M.; Li, B.; Bumgarner, A.; Rodgers, J.; Burcin, L. "Characterization of the 4 Mb Chalcogenide-Random Access Memory" *IEEE Non-Volatile Memory Technology Symposium* (2005) 97-104; and Cho, W. Y.; Cho, B.-H.; Choi, B.-G.; Oh, H.-R.; Kang, S.; Kim, K.-S.; Kim. K.-H.; Kim, E-E.; Kwak, C.-K.; Byun, H.-G.; Hwang, Y.; Ahn, S.; Koh, G.-H.; Jeong, G.; Jeong, H.; Kim, K. "A 0.18-um 3.0-V 64-Mb nonvolatile phase-transition random access memory (PRAM)" *IEEE J Solid-State Circuits* 40 (2005) 293-300] but there have been many challenges to the implementation of a phase-change memory product such as the high programming current requirements, variation in switching voltages and ON/OFF resistance ratios, thermal stresses on the materials, and their adhesion to the electrodes. See also U.S. Patent Publication 2007/0029537 A1.

SUMMARY OF THE INVENTION

Our work has focused on exploring alternative materials and device structures suitable for phase-change memory operation. Recently we have investigated devices consisting of two chalcogenide layers (FIG. 3) instead of a single layer alloy of chalcogenide material (such as GST). By using two chalcogenide layers, one a Ge-chalcogenide (the memory layer), and the other a Sn-chalcogenide (the metal chalcogenide layer), we hoped to reduce the voltages, currents, and switching speeds needed for phase-change memory operation without the need for a complicated physical device structure [see Cho, W. Y.; Cho, B.-H.; Choi, B.-G.; Oh, H.-R.; Kang, S.; Kim, K.-S.; Kim. K.-H.; Kim, E-E.; Kwak, C.-K.; Byun, H.-G.; Hwang, Y.; Ahn, S.; Koh, G.-H.; Jeong, G.; Jeong, H.; Kim, K. "A 0.18-um 3.0-V 64-Mb nonvolatile phase-transition random access memory (PRAM)" *IEEE J Solid-State Circuits* 40 (2005) 293-300; Lankhorst, M. H. R.; Ketelaars, Bas W. S. M. M.; Wolters, R. A. M. "Low-cost and nanoscale non-volatile memory concept for future silicon chips" *Nature Materials* 4 (2005) 347-352; and Hamann, H. F.; O'Boyle, M.; Martin, Y. C.; Rooks, M.; Wickramasinghe, H. K. "Ultra-high-density phase-change storage and memory" *Nature Materials* 5 (2006) 383-387].

Devices with three types of material stacks were fabricated for this study: $GeTe/SnTe$; $Ge_2Se_3/SnTe$; and $Ge_2Se_3/SnSe$. While Te-based chalcogenides are well studied for use in phase-change memory applications [see Bez, R.; Pirovano, A. "Non-volatile memory technologies: emerging concepts and new materials" *Materials Science in Semiconductor Processing* 7 (2004) 349-355; Lacaita, A. L. "Phase-change memories: state-of-the-art, challenges and perspectives" *Solid-State Electronics* 50 (2006) 24-31; and Chen, M.; Rubin, K. A.; Barton, R. W. "Compound materials for reversible, phase-change optical data storage" *Appl. Phys. Lett.* 49 (1986)

502-504], we know of no reports of phase-change memory operation with GeSe-based binary glasses. In this work, we have explored the possibility of inducing a phase-change response in the $Ge_2Se_3$/Sn chalcogenide stack structures. We selected the $Ge_2Se_3$ glass since, like the GeTe glass, it contains homopolar Ge—Ge bonds which we believe may provide nucleation sites for crystallization during the phase-change operation, thus improving the phase-change memory response [see An, S.-H.; Kim, D.; Kim, S. Y. "New crystallization kinetics of phase-change of $Ge_2S_2Te_5$ at moderately elevated temperature" Jpn. J. Appl. Phys. 41 (2002) 7400-7401]. Additionally, the $Ge_2Se_3$ glass offers the advantage of higher glass transition temperatures ($Ge_2Se_3$: $T_g>613$ K [see Feltz, A. *Amorphous Inorganic Materials and Glasses*, VCH Publishers Inc., New York, 1993, pg. 234]) over the Te-based glasses (GeTe: $T_g=423$ K [see Chen, M.; Rubin, K. A. "Progress of erasable phase-change materials" *SPIE Vol. 1078 Optical Data Storage Topical Meeting* (1989) 150-156]; GST: $T_g=473$ K [see Hamann, H. F.; O'Boyle, M.; Martin, Y. C.; Rooks, M.; Wickramasinghe, H. K. "Ultra-high-density phase-change storage and memory" Nature Materials 5 (2006) 383-387]), thus providing more temperature tolerance during manufacturing.

One possible benefit of the metal-chalcogenide layer is the potential for formation of an Ohmic contact between the electrode and the memory layer due to the presence of a low bandgap material like SnTe ($E_g=0.18$ eV at 300K [see Esaki, L.; Stiles, P. J. "New Type of Negative Resistance in Barrier Tunneling" *Phys. Rev. Lett.* 16 (1966) 1108-1111]) between the electrode and the chalcogenide switching layer. An Ohmic contact will allow a lower voltage to be applied to the memory cell since a Schottky barrier does not need to be overcome in order to achieve the current necessary for phase-change switching. Another potential benefit of the Sn-chalcogenide layer is better adhesion of the memory layer to the electrode. The better adhesion provided by the SnTe layer may help prevent delamination of the electrode from the chalcogenide memory layer, as can occur after repeated thermal cycles [see Hudgens, S.; Johnson, B. "Overview of Phase-Change Chalcogenide Nonvolatile memory Technology" *MRS Bulletin*, November 2004, 829-832]. In addition to these potential benefits, the Sn-chalcogenide may provide a region with 'graded' chalcogenide concentration between the Sn-chalcogenide and the Ge-chalcogenide memory switching layer due to the ability of the chalcogenide to form bridging bonds between the Sn and Ge atoms in the Sn-chalcogenide and Ge-chalcogenide layers, respectively. Lastly, as we show in this work, the Sn-chalcogenide material may assist in phase-change memory switching by donating Sn-ions to the Ge-chalcogenide layer during operation, thus allowing chalcogenide materials which normally do not exhibit phase change memory switching to be chemically altered post processing into an alloy capable of phase change response.

DETAILED DESCRIPTION OF THE PREFERRED EMBODIMENTS

Referring to the Figures, there are shown some, but not the only, embodiments of the invention.

Figure 1:
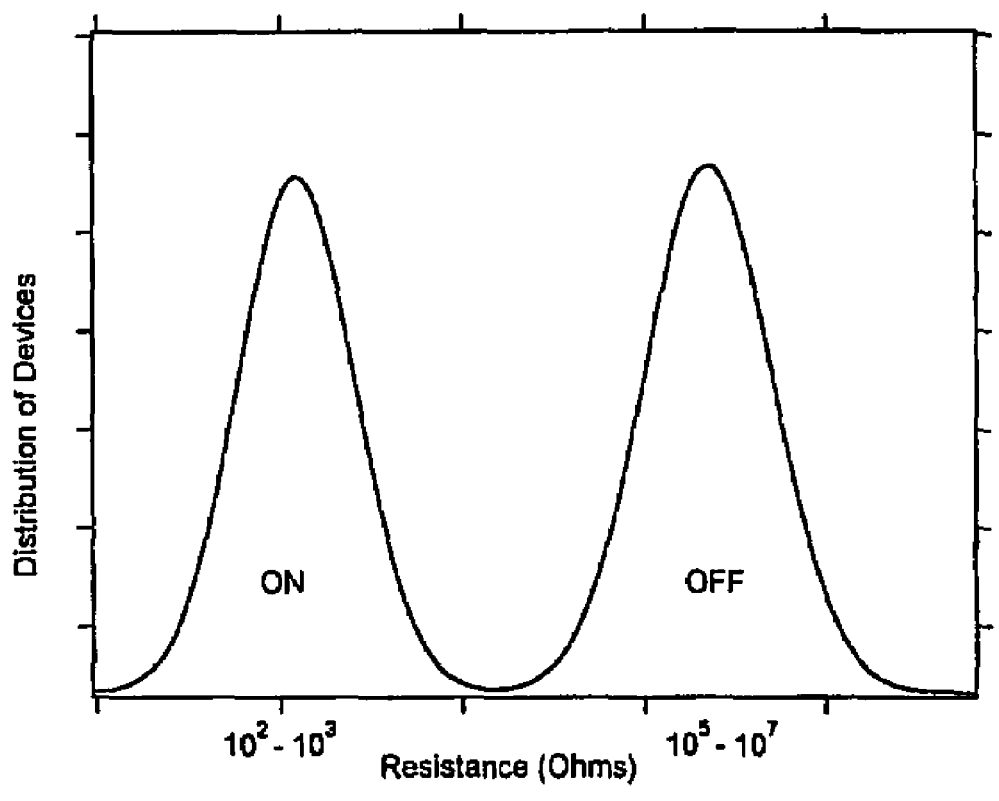
FIG. 1 is a graph depicting an example distribution of low and high resistance values defining a logic '1' and '0' state, respectively, of a resistance variable memory.
Figure 2:
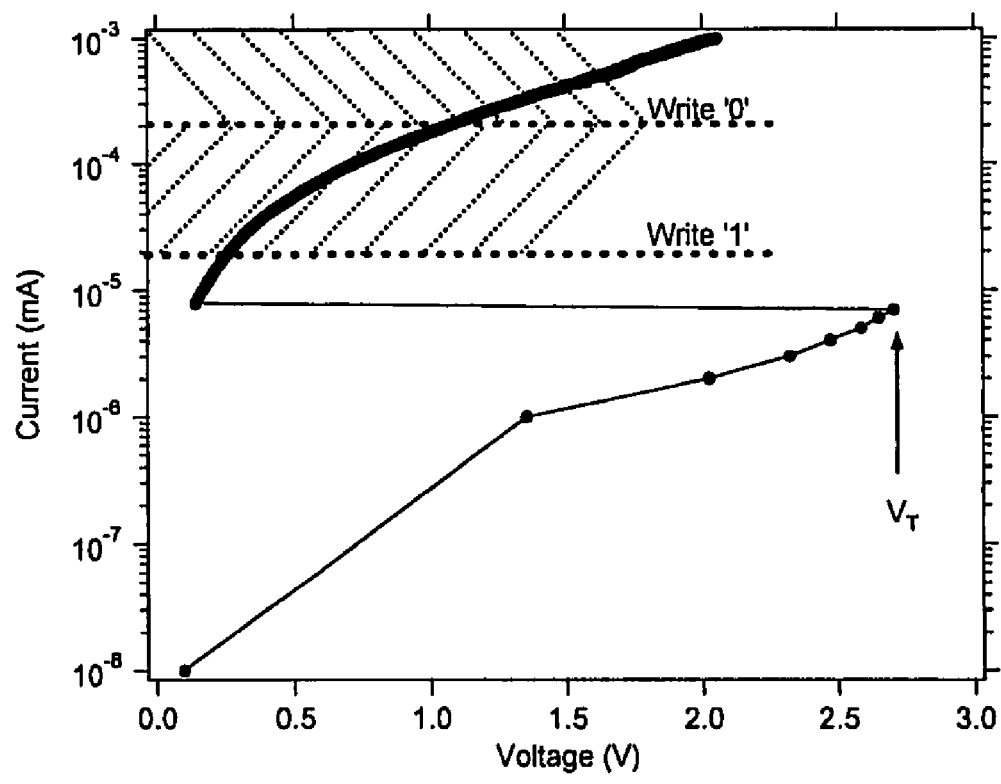
FIG. 2 is a graph depicting the relationship between current through the memory cell material and the formation of a low (write '1') or high (write '0') resistance state.
Figure 3:
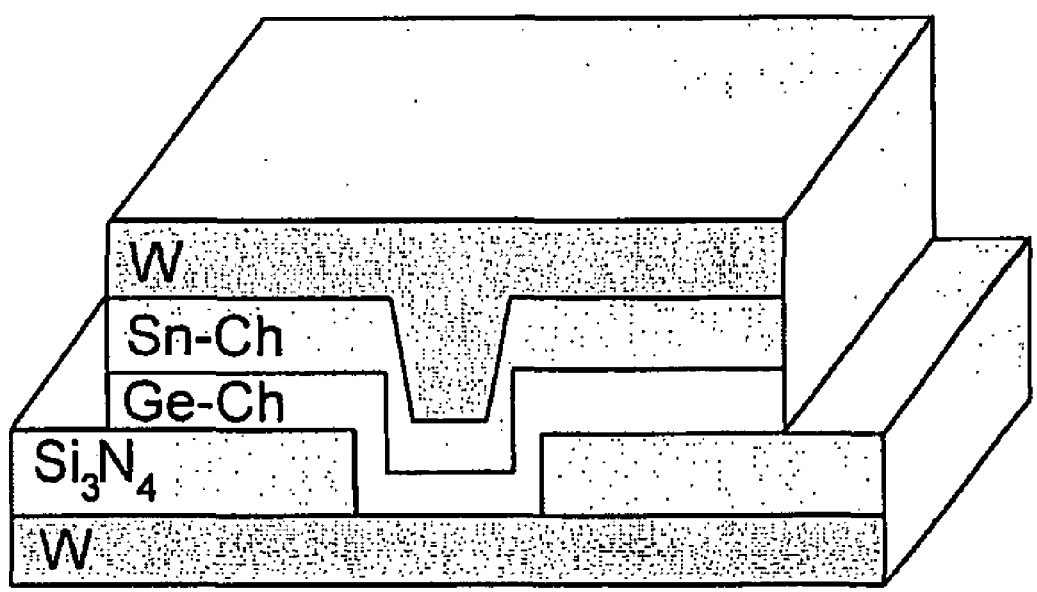
FIG. 3 is a top perspective schematic view of the device structures according to the present invention as tested. The notation Ge-Ch/Sn-Ch indicates a device with this structure with the films listed in the order nearest the bottom electrode to nearest the top electrode.

FIG. 3 shows a top perspective view of a device structure, according to the present invention, used in this study. The device structure consists of a via through a nitride layer to a W bottom electrode deposited on 200 mm p-type Si wafers. The chalcogenide material layers were deposited with the Ge-chalcogenide layer first, followed by the Sn-chalcogenide layer. Prior to deposition of the first chalcogenide layer, the wafers received an $Ar_+$ sputter etch to remove residual material and any oxide layer that may have formed on the W electrode. The $Ge_2Se_3$ layer was deposited by sputtering with an Ulvac ZX-1000 from a target composed of pressed $Ge_2Se_3$ powder. The GeTe, SnTe, and SnSe layers were prepared by thermal evaporation of GeTe, SnTe, and SnSe (all from Alfa Aesar, 99.999% purity) using a CHA Industries SE-600-RAP thermal evaporator equipped with three 200 mm wafer planetary rotation. The rate of material deposition was monitored using an Inficon IC 6000 with a single crystal sensor head. The base system pressure was $1\times10^{-7}$ Torr prior to evaporation.

Using the planetary rotator, evaporated films were deposited on two types of wafers simultaneously in each experiment: (1) a film characterization wafer consisting of a p-type Si wafer substrate with the layers 350 Å W/800 Å $Si_3N_4$ and, (2) two wafers processed for device fabrication consisting of vias etched through a $Si_3N_4$ layer to a W electrode for bottom electrode contact (FIG. 3). The film characterization wafer present in each evaporation step was used to characterize the actual thin-film material stoichiometry post evaporation since thermally evaporated films often have a stoichiometry different than the starting material. The evaporation chamber was opened to the ambient atmosphere between the GeTe, SnTe, and SnSe film depositions in order to expose the GeTe films to similar ambient atmospheric conditions as the sputtered $Ge_2Se_3$ films which had to get exposed to the atmosphere during transfer from the sputtering tool to the evaporator for the Sn-chalcogenide film deposition. After the evaporation step(s) were complete, the device fabrication wafers continued processing through top electrode deposition (350 Å sputtered W), photo steps, and dry etch to form fully functional devices consisting of a bottom electrode, chalcogenide material layers, and top electrode. Dry etch was performed by ion-milling with a Veeco ion-mill containing a quadrupole mass spectrometer for end-point detection.

The films were characterized with ICP to determine the variation in composition of the film compared to the starting material. ICP data provided film stoichiometry with an accuracy of +/−0.8% using a Varian Vista-PRO radial ICP. The chalcogenide films were removed from the wafer prior to ICP analysis with an etching solution of 1:1 $HCl:HNO_3$. XRD, performed with a Siemen's DS5000, was used to qualitatively identify amorphous or polycrystalline films. TEM measurements were made with a Phillips Model CM300.

Electrical measurements were made using a Micromanipulator 6200 microprobe station equipped with temperature controllable wafer chuck, a Hewlett-Packard 4145B Parameter Analyzer, and Micromanipulator probes with W tips (Micromanipulator size 7A). The tested devices were 0.25 um in diameter with 80 um×80 um pads for electrical contact to the top and bottom electrodes.

Results and Discussion

Figure 4:
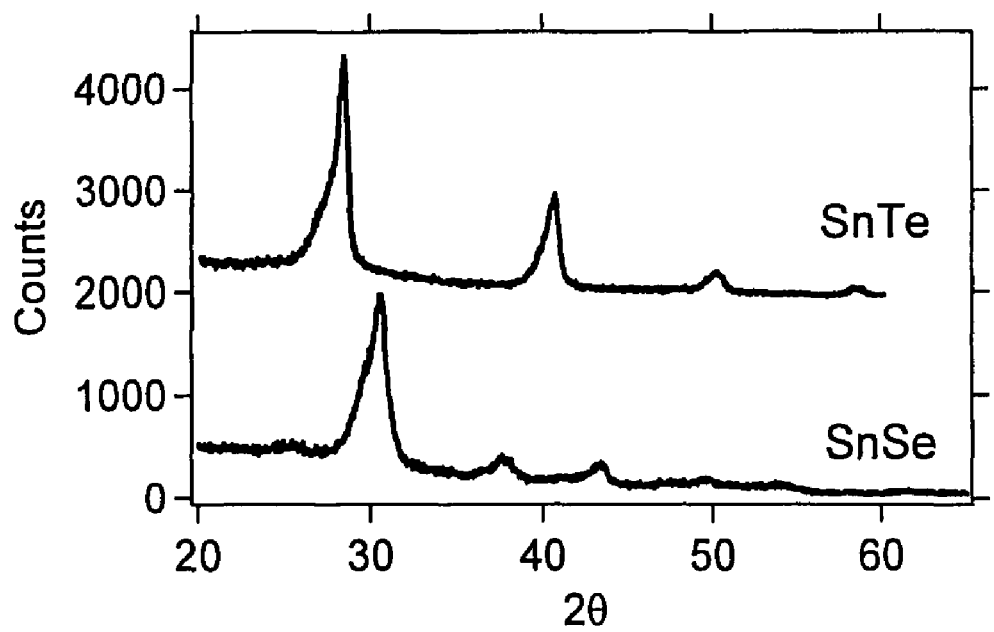
FIG. 4 is a graph depicting XRD spectra of SnTe and SnSe evaporated films.

The GeTe and $Ge_2Se_3$ films were amorphous as deposited with no observable XRD peaks. The SnTe and SnSe films were polycrystalline, as indicated by their XRD spectra (FIG. 4). Due to the nature of the evaporation process, and the relatively high pressure of the evaporation chamber prior to film deposition (1E-7 Torr), oxygen is most likely incorporated into the SnTe, SnSe, and GeTe films during deposition. Our previous X-ray photoelectron spectroscopy measurements on evaporated films have shown that the percentage of oxygen in an evaporated film can be as high as 10%.

Table 1 provides the ICP results for the film characterization wafers that were included in the evaporation step with the device wafers in this study, as well as for a sputtered $Ge_2Se_3$ film wafer. Note that the only elements measured by ICP analysis were Ge, Se, Sn, and Te. The presence of oxygen is not detected with ICP and is not factored into the overall film composition. The evaporated SnTe and SnSe layers are almost stoichiometric, whereas the GeTe layer was deposited slightly Te-rich (53% compared to 50%). The sputtered $Ge_2Se_3$ films are stoichiometric.

TABLE 1

Device types fabricated for this study and their actual thin film compositions measured with ICP (within +/−0.8%). Note that ICP analysis does not measure oxygen in the film, therefore the concentrations of the elements indicate only relative concentrations of Ge, Se, Sn, or Te in the film.

| Device Stack | Layer 1 Composition | Layer 2 Composition |
| --- | --- | --- |
| GeTe/SnTe | $Ge_{47}Te_{53}$ | $Sn_{49}Te_{51}$ |
| $Ge_2Se_3$/SnTe | $Ge_{40}Se_{60}$ | $Sn_{49}Te_{51}$ |
| $Ge_2Se_3$/SnSe | $Ge_{40}Se_{60}$ | $Sn_{49}Se_{51}$ |

Figure 5:
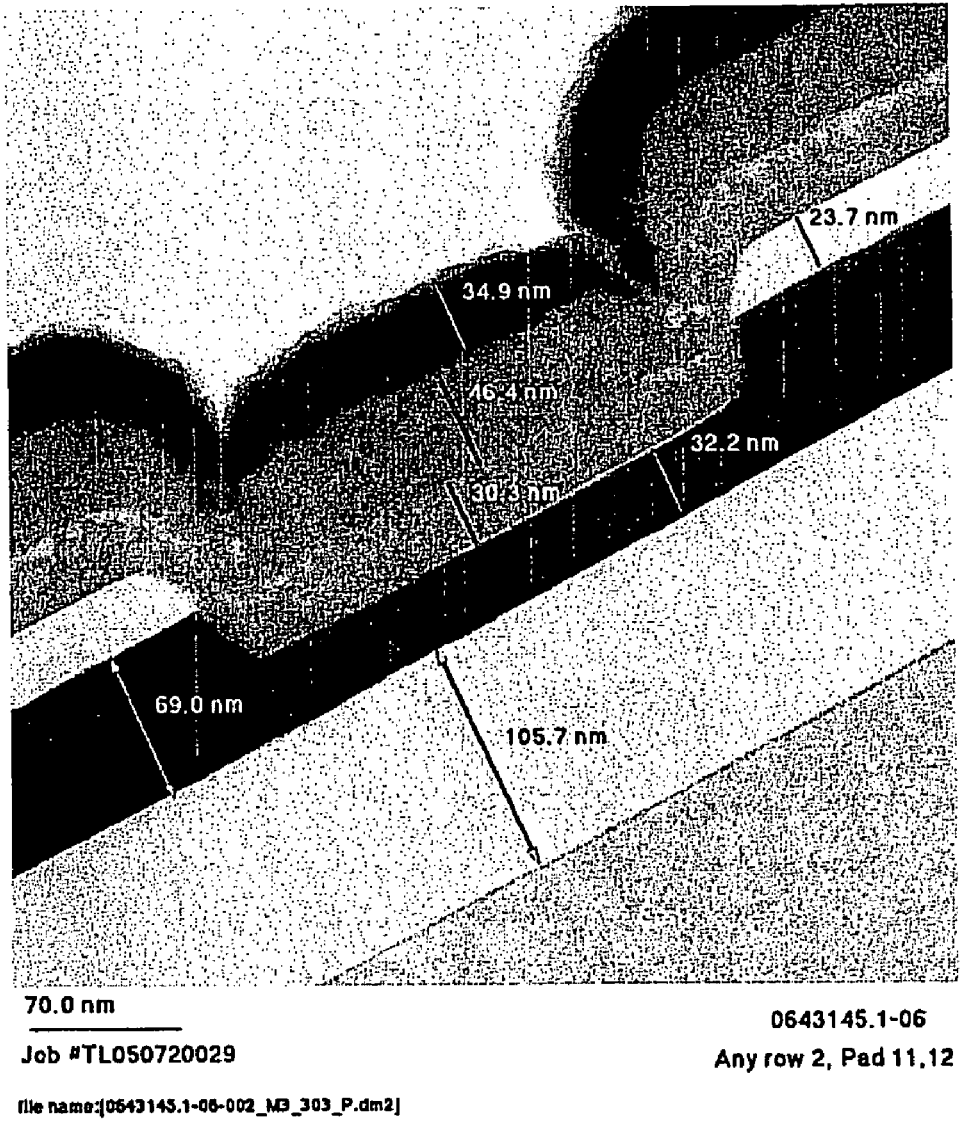
FIG. 5 is a TEM image of a GeTe/SnTe device according to the present invention.

(a) GeTe/SnTe device—A TEM cross section image of a GeTe/SnTe device is shown in FIG. 5. The evaporated material has reduced step coverage over the sidewalls of the via, leading to thinner films in this region of the devices. The pre-sputter etch clean etches into the W bottom electrode by roughly 300 Å. Thus, the device structure consists of not only a via through Si3N4, but also an indented bottom electrode which subsequently allows the chalcogenide phase-change material to be in contact at the sides and bottom of the layer near the metal electrode.

Figure 6:
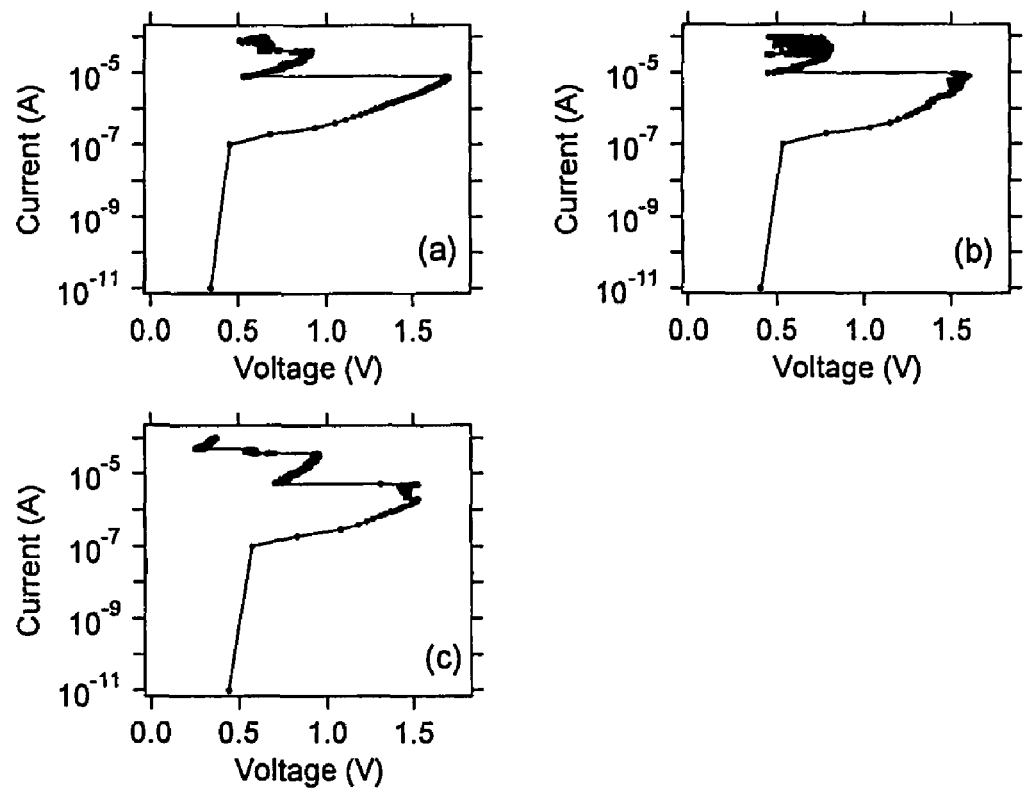
FIG. 6 is a set of IV-curves for three unique GeTe/SnTe devices according to the present invention, showing the device-to-device variation typically observed in these devices. A positive potential was applied to the top electrode in each case.

Typical DC IV-curves for devices with the GeTe/SnTe stack structure are shown in FIG. 6. These curves were collected by forcing the current thru the devices from 10 pA to 100 ∝A and measuring the corresponding voltage across the devices with the positive potential on the electrode adjacent to the SnTe layer (the top electrode). The IV-curves, showing a 'snap-back', i.e. negative resistance, at the threshold voltage as well as a reduction in device resistance after sweeping the current, are characteristic of a phase-change memory device. There is slight device-to-device variation observed in IV-curves of unique devices (FIG. 6a-c). However, in each case the threshold voltage is less than 1.8 V and there are at least two 'snap-back' regions in the IV-curves. The additional 'snap-back' responses indicate that our devices may exhibit multi-state behavior. However, the stability of each resistance state is as yet unclear. Additionally, the cycling endurance and switching properties of each state have not been explored. Similar results, though not as well defined as those in FIG. 6, have been obtained on stacked Chalcogenide layers of GST/Si-doped GST [see Lai, Y. F.; Feng, J.; Qiao, B. W.; Cai, Y. F.; Lin, Y. Y.; tang, T. A.; Cai, B. C.; Chen, B. "Stacked chalcogenide layers used as multi-state storage medium for phase-change memory" *Appl. Phys. A* 84 (2006) 21-25] and are being explored as multi-state phase-change memories.

Figure 7:
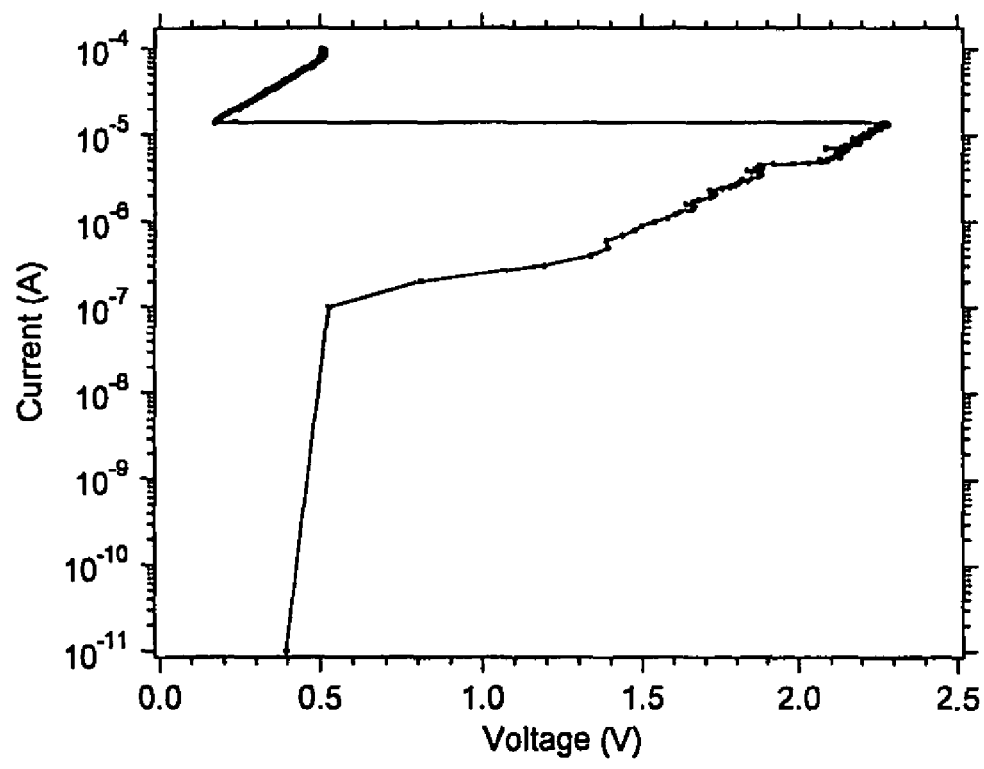
FIG. 7 is a representative IV-curve for a GeTe/SnTe device according to the present invention, with a negative potential applied to the top electrode. A positive potential has never been applied to the device top electrode prior to this measurement.

When the electrodes are reversed and a negative potential is placed on the device top electrode, the DC IV-curve is altered, as shown in FIG. 7, but the device still exhibits phase-change behavior. In this electrical configuration the threshold voltage has increased above 2V. In either potential polarity configuration, the threshold voltage and programming currents that we observe for the GeTe/SnTe stack structure are lower than those reported for recent single devices comprised of GST [see Lv, H.; Zhou, P.; Lin, Y.; Tang, T.; Qiao, B.; Lai, Y.; Feng, J.; Cai, B.; Chen, B. "Electronic Properties of GST for Non-Volatile Memory" Microelectronics Journal, in press].

Table 2 provides a comparison of the typical initial resistance of a device prior to switching and the programmed resistance after switching, as well as the measured threshold voltage for both the positive and negative current sweep cases. The resistances were measured at +20 mV in each case, a potential too low to perturb the state of the bit. Included in Table 2 are the typical programmed resistances when the current is swept to 1 mA (for both the positive and negative potential cases). Of note is the programmed resistance when the current is swept to a −1 mA (top electrode at a negative potential) compared to the case when the current is swept to +1 mA. There is almost an order of magnitude decrease in the programmed resistance when +1 mA is forced at the top electrode compared to the bottom electrode. However, our results indicate that it is not necessary to use a current as high as 1 mA in order to program the bits (see the 100 uA results in Table 2).

TABLE 2

Typical initial and programmed resistances and threshold voltages for devices programmed with +/−100 uA and +/−1 mA of current. A '—' indicates no measurable response. Resistance was measured at 20 mV.

| Device Stack | Initial Resistance (Ohms) | Programmed Resistance (Ohms) +100 uA/−100 uA | Programmed Resistance (Ohms) +1 mA/−1 mA | Threshold Voltage +sweep/ −sweep |
|---|---|---|---|---|
| GeTe/SnTe | $>5 \times 10^6$ | $1 \times 10^4/2 \times 10^4$ | $5 \times 10^2/3 \times 10^3$ | 1.6 V/2.5 V |
| $Ge_2Se_3$/SnTe | $>6 \times 10^6$ | $2 \times 10^3/3 \times 10^5$ | $7 \times 10^2/7 \times 10^2$ | 3.7 V/3.7 V |
| $Ge_2Se_3$/SnSe | $>6 \times 10^6$ | $1 \times 10^3/$— | $5 \times 10^2/$— | 3.7 V/— |
| $Ge_2Se_3$/SnSe (low current test) | $>6 \times 10^6$ | $2 \times 10^8$ (+30 nA limit)/ $1 \times 10^5$ (−2 uA limit) | No data | —/2.5 V |

Figure 8:
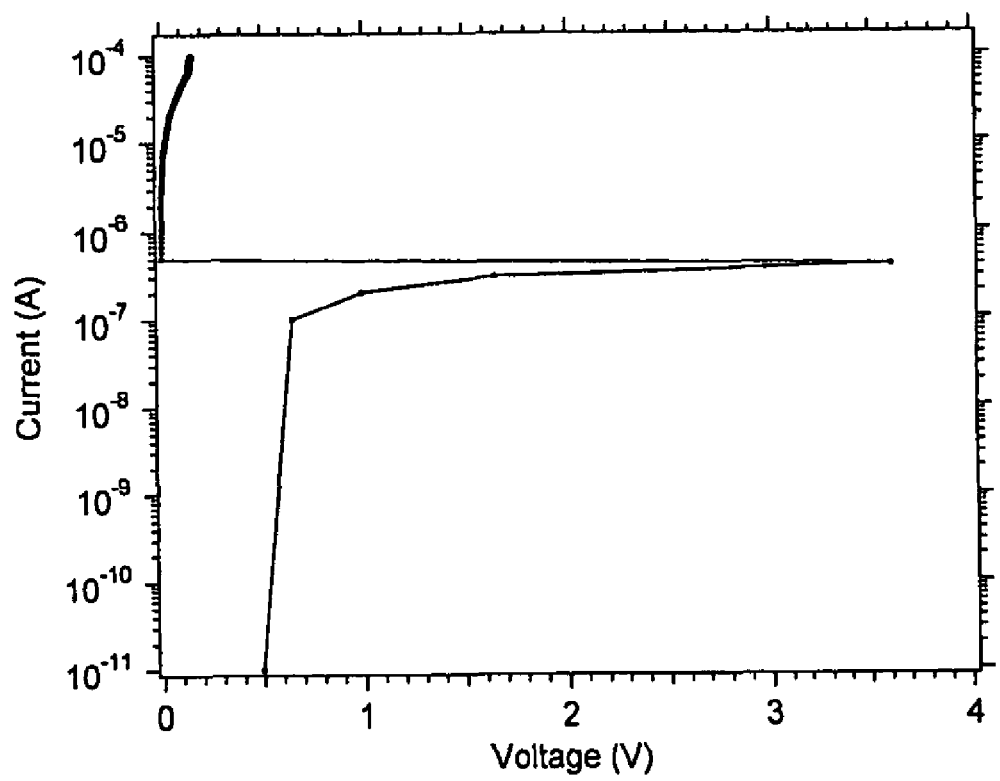
FIG. 8 is a representative IV-curve for a $Ge_2Se_3$/SnTe device according to the present invention, with a positive potential applied to the top electrode.

(b) $Ge_2Se_3$/SnTe device—When the GeTe glass is replaced with a $Ge_2Se_3$ glass, the resultant $Ge_2Se_3$/SnTe devices exhibit resistance variable memory switching, FIG. 8. However, there are two distinct differences in the DC IV-curve compared to the GeTe/SnTe case. First, the threshold voltage, when the top electrode is at a positive potential, is higher in the $Ge_2Se_3$ case (greater than 3.5 V compared to less than 1.8 V for the GeTe/SnTe case). Second, the threshold voltage occurs at a current which is an order of magnitude lower than in the GeTe devices. Additionally, the $Ge_2Se_3$/SnTe devices exhibit better device-to-device consistency in their IV-curves than the evaporated GeTe/SnTe devices, most likely due to the better via sidewall film step-coverage inherent in the sputtered $Ge_2Se_3$ film, as well as a reduction in film impurities (such as oxygen).

Figure 9:
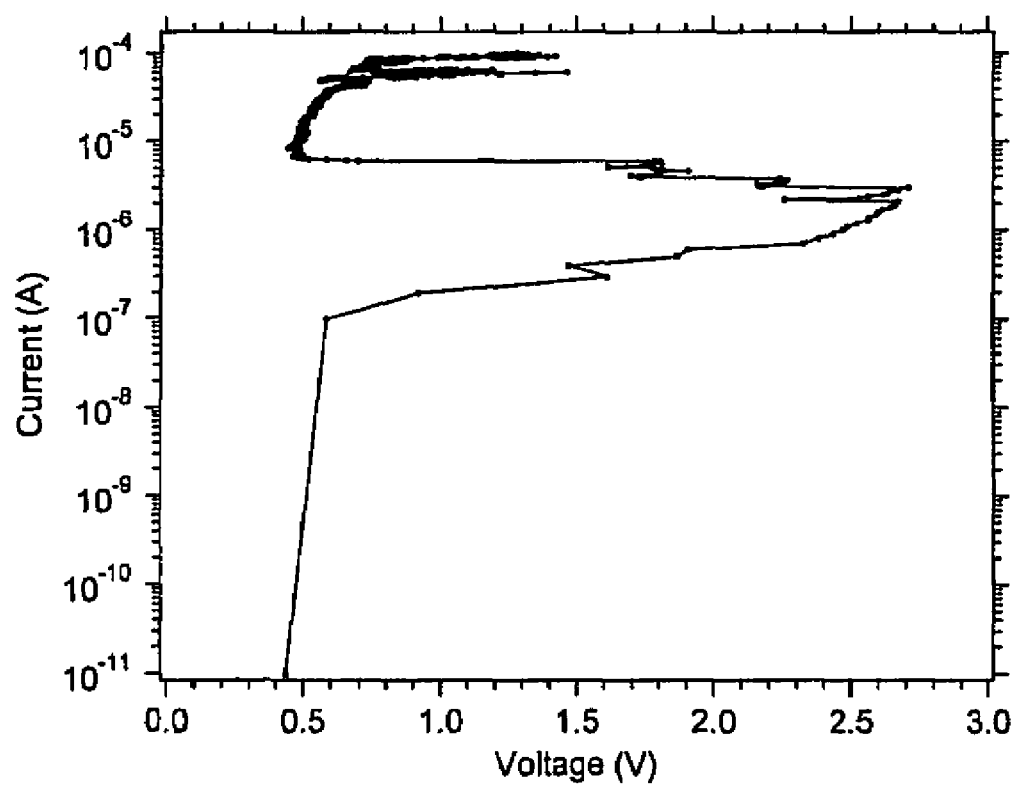
FIG. 9 is a representative IV-curve for a $Ge_2Se_3$/SnTe device according to the present invention, with a negative potential applied to the top electrode. A positive potential has never been applied to the device top electrode prior to this measurement.

FIG. 9 shows the corresponding current sweep IV-curves for the $Ge_2Se_3$/SnTe structure with a negative potential on the top electrode. The IV-curves for this negative current sweep show a much less well-defined threshold voltage than the positive current sweep case. In addition, the current at the threshold voltage is much higher than the positive current sweep case (FIG. 8). However, the negative potential $Ge_2Se_3$/SnTe IVcurve (FIG. 9) shows similar threshold voltages and currents to the negative potential GeTe/SnTe IV-curve (FIG. 7).

Figure 10:
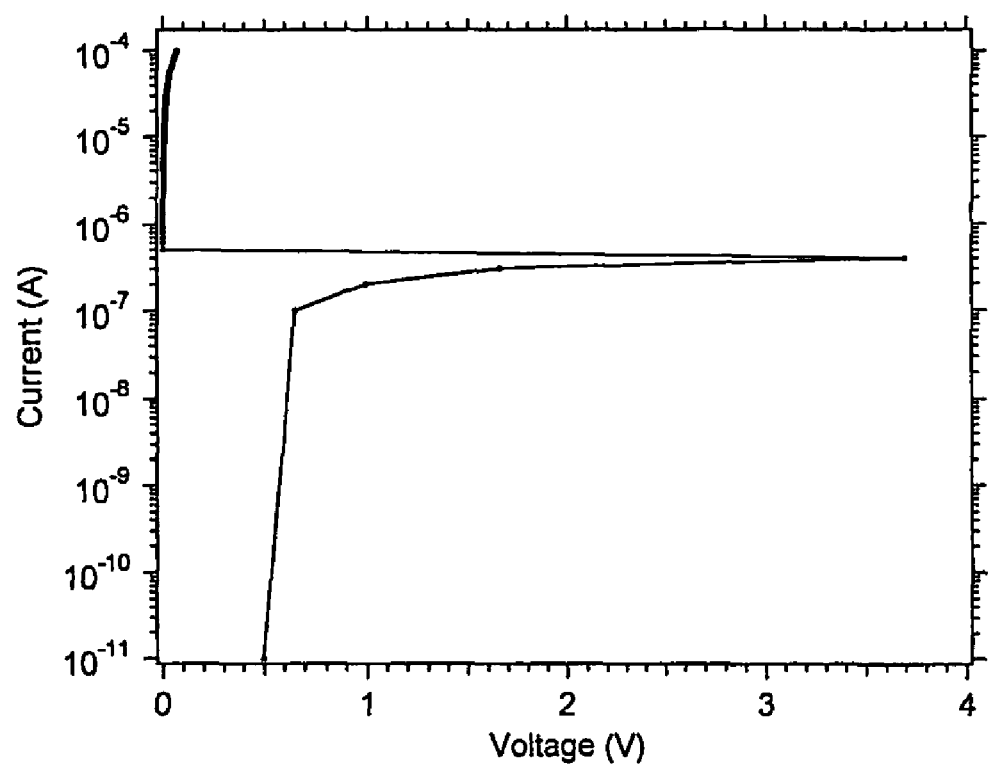
FIG. 10 is a representative IV-curve for a $Ge_2Se_3$/SnSe device according to the present invention, with a positive potential applied to the top electrode.
Figure 11:
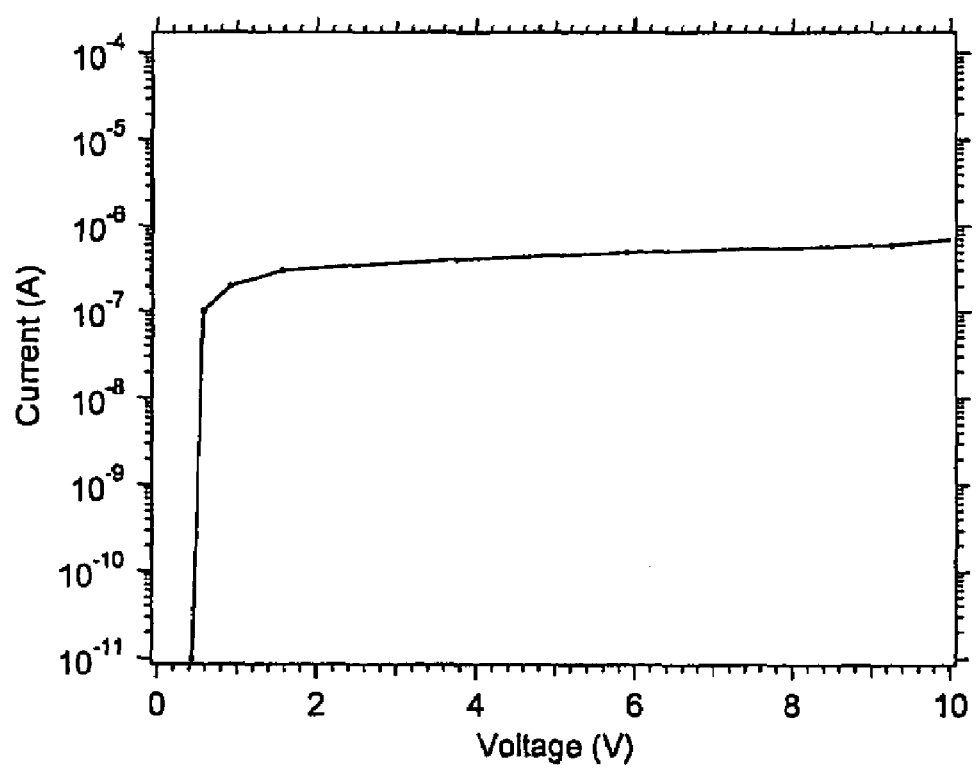
FIG. 11 is an IV-curve of a $Ge_2Se_3$/SnSe device according to the present invention, with the top electrode at a negative potential. A positive potential has never been applied to the device top electrode prior to this measurement.

(c) $Ge_2Se_3$/SnSe device—When the SnTe layer is replaced with a SnSe layer in the $Ge_2Se_3$ stack, resistance switching is observed (FIG. 10) when a positive voltage is applied to the top electrode. The DC IV-curves for the $Ge_2Se_3$/SnSe device (FIG. 10) and the $Ge_2Se_3$/SnTe device (FIG. 8) show no differences due to the SnSe layer. However, when a negative potential is applied to a device that has not previously seen a positive potential, no threshold voltage is observed in the IV-curve (FIG. 11). This is in contrast to the case of the negative potential applied to a $Ge_2Se_3$/SnTe device (FIG. 9) where phasechange switching is observed with a threshold voltage less than 3 V.

The absence of a threshold voltage in the negative current sweep IV-curve (FIG. 11), but its presence in the positive current sweep IV-curve (FIG. 10) of the $Ge_2Se_3$/SnSe device implies that during the application of a positive potential there may be Sn-ion migration from the SnSe layer into the $Ge_2Se_3$ layer which chemically alters the $Ge_2Se_3$ layer to a $(Ge_2Se_3)_xSn_y$ alloy capable of phase-change operation. The migration of Sn ions into the lower glass layer may also explain the switching observed in the $Ge_2Se_3$/SnTe device when a positive potential is applied to the top electrode. However, unlike the $Ge_2Se_3$/SnSe device, switching is observed in the $Ge_2Se_3$/SnTe device when a negative potential is applied to the top electrode. A possible explanation for the observed negative potential switching in the $Ge_2Se_3$/SnTe device (FIG. 9) is that $Te^{2-}$-ions from the SnTe layer may be electrically driven by the negative potential into the underlying $Ge_2Se_3$ glass layer, thus creating $(Ge_2Se_3)_xTe_y$ regions capable of phase-change switching.

Figure 12:
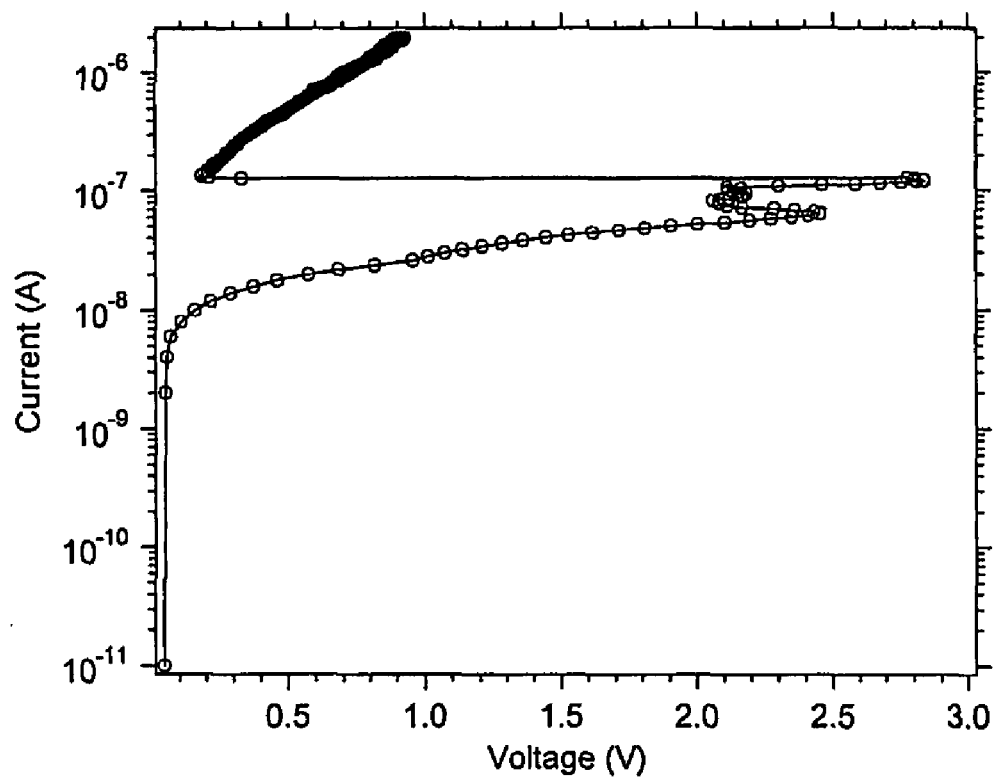
FIG. 12 is an IV-curve of a $Ge_2Se_3$/SnSe device according to the present invention, obtained with a negative potential applied to the top electrode after the application of a positive potential 'conditioning' signal consisting of a DC current sweep limited to 30 nA.

To explore the possibility that the phase-change switching in the $Ge_2Se_3$/SnSe device is facilitated by Sn-ion migration into the $Ge_2Se_3$ layer, the $Ge_2Se_3$/SnSe device, was initially tested by applying a positive potential 'conditioning' signal to the top electrode. This 'conditioning' signal was a DC current sweep limited to 30 nA in order to prevent any phase-change from occurring, but with enough potential (~3 V) to drive Sn-ions into the $Ge_2Se_3$ layer. After this 'conditioning' signal was applied to the $Ge_2Se_3$/SnSe device, a negative potential was applied to the top electrode and the IV curve was measured (FIG. 12). A voltage 'snap-back' is observable at two separate current values, 60 nA and 100 nA. This double 'snap-back' is representative of the IV curves of the devices measured with this conditioning technique. Device resistances after application of the negative potential (post conditioning) were in the range of 30 kOhms to 200 kOhms.

The $Ge_2Se_3$/SnTe and GeTe/SnTe stacks were also subjected to this 'conditioning' signal test. However, their negative current DC IV-curves were not appreciably altered after application of the positive 'conditioning' voltage.

Conclusions

Phase-change memory switching was observed in devices consisting of two stacked layers of chalcogenide material: a Ge-based layer (GeTe or $Ge_2Se_3$), and a tin chalcogenide layer (SnTe or SnSe). The observed switching is dependent upon the polarity of potential applied to the electrode adjacent to the SnTe or SnSe layer. When a positive potential is applied to this electrode, the formation of Sn-ions and their migration into the adjacent GeTe or $Ge_2Se_3$ layer most likely contributes to the phase-change response of the material.

We attribute the switching of the $Ge_2Se_3$/SnTe device under negative applied potential, with no previously applied positive 'conditioning' voltage, to the migration of Te anions into the $Ge_2Se_3$ layer during application of the negative potential. The possible Te anion migration may alter the $Ge_2Se_3$ glass layer into a $(Ge_2Se_3)_xTe_y$ alloy capable of phase-change memory operation.

In the case of the Ge$_2$Se$_3$/SnSe device, no Te anions are available to migrate into the Ge$_2$Se$_3$ glass layer when a negative potential is applied to the top electrode, and no phase-change behavior is observed in the IV-curve. If it were possible for Se anions to be forced into the Ge$_2$Se$_3$ glass from the SnSe layer (analogous to the Te anions from the SnTe layer), they would succeed only in making the Ge$_2$Se$_3$ glass Se-rich and thus still incapable of phase-change switching. Alternatively, if a positive potential is initially applied across the Ge$_2$Se$_3$/SnSe device and the current is limited to a low enough value to prohibit Joule heating, but still allow a high enough potential across the device for Sn-ion migration, Sn-ions may migrate into the Ge$_2$Se$_3$ layer, creating a (Ge$_2$Se$_3$)$_x$Sn$_y$ alloy which is capable of phase-change switching when a negative potential is applied to the top electrode.

The addition of metal ions, forced into the chalcogenide switching layer during the first 'forming' electrical pulse, not only facilitates electrical switching, but it also may allow for more than one ON resistance state. This phase change memory alloy, formed in-situ, may exhibit more than one crystallization temperature. Each crystallization temperature corresponds to a unique phase of the material, and thus a unique resistance. This means that by proper selection of the metal that is allowed to migrate into the chalcogenide glass, the alloy can be tuned to have more than one crystalline phase.

We further investigated this concept by synthesizing materials using the Ge$_x$Se$_y$ chalcogenide glass and adding small concentrations (1 and 3%) of various metals, and measuring the thermal properties of these materials. Metals we have tested include, Sn, Zn, In, and Sb. The Sn and In addition showed the presence of two crystallization regions whereas the Zn showed three crystallizations regions. Thus the Ge$_x$-Se$_y$Zn$_z$ alloy has the potential to have four logic states. This alloy can be formed in-situ, for example, by using a device comprising the layers of Ge$_2$Se$_3$/ZnSe.

GeTeSn materials have been well studied for their application as optical phasechange materials [see Chen, M.; Rubin, K. A. "Progress of erasable phase-change materials" *SPIE Vol.* 1078 *Optical Data Storage Topical Meeting* (1989) 150-156]. GeTe exhibits fast crystallization under optically induced phasechange operation (<30 ns) and it crystallizes in a single phase (no phase separation) making it attractive for phase-change operation. However, the number of optically induced write/erase cycles that could be achieved was quite low (<500) [see Chen, M.; Rubin, K. A. "Progress of erasable phase-change materials" *SPIE Vol.* 1078 *Optical Data Storage Topical Meeting* (1989) 150-156]. Our initial electrical cycling endurance tests on the GeTe/SnTe and Ge$_2$Se$_3$/SnTe devices and have shown endurance greater than 2 million cycles. Due to the potential for parasitic capacitances during the endurance cycling measurements, care must be taken in the measurement experimental setup [see Ielmini, D.; Mantegazza, D.; Lacaita, A. L. "Parasitic reset in the programming transient of PCMs" *IEEE Electron Device Letters* 26 (2005) 799-801]; with this in mind, better cycling measurements are currently in progress [see Campbell, K. A.; Anderson, C. M., Microelectronics Journal 38 (2007) 52-59].

Future studies will investigate the temperature dependence, AC switching and lifetime cycling endurance of each of these device types. Additionally, we will investigate the phase-change switching response of stack structure devices that use a metal-chalcogenide layer with a metal different than tin, such as zinc, which is expected to have much different mobility in an applied field as well as a much different chemical incorporation into the Ge-chalcogenide glass layer. It is possible that the presence of Ge—Ge bonds in the Ge-based layer assist in the incorporation of the metal ions or of the Te anions into the glass by providing an energetically feasible pathway (that of the Ge—Ge bonds) for Te- or metal-ion incorporation [see Narayanan, R. A.; Asokan, S.; Kumar, A. "Influence of Chemical Disorder on Electrical Switching in Chalcogenide Glasses" *Phys. Rev. B* 63 (2001) 092203-1-092203-4; and Asokan, S. "Electrical switching in chalcogenide glasses—some newer insights" *J Optoelectronics and Advanced Materials* 3 (2001) 753-756]. Ge—Ge bonds are known to be thermodynamically unstable [see Feltz, A. *Amorphous Inorganic Materials and Glasses*, VCH Publishers Inc., New York, 1993, pg. 234], and in the presence of other ions, will easily break and allow formation of a new bond (e.g. GeTe or GeSn). Future work will investigate the role of the Ge—Ge bond by testing the electrical performance of devices made with Ge-chalcogenide stoichiometries that provide no Ge—Ge bonds, such as Ge$_{25}$Se$_{75}$.

Although this invention has been described above with reference to particular means, materials, and embodiments, it is to be understood that the invention is not limited to these disclosed particulars, but extends instead to all equivalents within the scope of the following claims.

I claim:

1. A device suitable for phase change memory operation comprising:
    a first layer comprising a chalcogenide material;
    a second layer comprising a metal chalcogenide material;
    wherein application of an electric field across the device causes a metal ion to move from the second layer to the first layer wherein the first layer incorporates the metal and forms a new chalcogenide alloy with a plurality of crystalline phases.

2. The device of claim 1 wherein the metal is either Sn, Zn, In, or Sb.

3. The device of claim 1 which comprises three or more logic states.

4. The device of claim 1 comprising a stack of chalcogenide-containing layers which exhibit phase change switching only after a reverse polarity voltage potential is applied across the stack causing ion movement into an adjacent layer and thus "activating" the device to act as a phase change random access memory device or a reconfigurable electronics device when the applied voltage potential is returned to the normal polarity.

5. The device of claim 1, wherein the first layer comprises a Ge-chalcogenide material.

6. The device of claim 5, wherein first layer comprises GeTe.

7. The device of claim 5, wherein first layer comprises Ge$_2$Se$_3$.

8. The device of claim 1, wherein the second layer comprises a Sn-chalcogenide material.

9. The device of claim 8, wherein second layer comprises SnTe.

10. The device of claim 8, wherein second layer comprises SnSe.

11. The device of claim 8, wherein second layer comprises ZnSe.

12. The device of claim 1, wherein the device is fabricated on a p-type Si wafer.

13. The device of claim 1, further comprising a third layer upon which the second layer is fabricated.

14. The device of claim 13, wherein the third layer comprises Si$_3$N$_4$.

15. The device of claim 1, further comprising a top electrode fabricated over the first layer and a bottom electrode fabricated under the second layer.

16. The device of claim 15, wherein the bottom electrode comprises tungsten.

17. The device of claim 15, wherein the top electrode comprises tungsten.

18. The device of claim 15, wherein the second layer is connected to the bottom electrode with a via.

19. The device of claim 1, wherein the second layer comprises Zn, In, or Sb.

20. The device of claim 1, wherein the new chalcogen alloy comprises Ge, Se, and Zn.

* * * * *